US009874593B2

(12) United States Patent
Kang et al.

(10) Patent No.: US 9,874,593 B2
(45) Date of Patent: Jan. 23, 2018

(54) DECISION SUPPORT SYSTEM FOR OUTAGE MANAGEMENT AND AUTOMATED CREW DISPATCH

(71) Applicant: ABB Inc., Cary, NC (US)

(72) Inventors: Ning Kang, Cary, NC (US); Mirrasoul Mousavi, Cary, NC (US)

(73) Assignee: ABB Inc., Cary, NC (US)

( * ) Notice: Subject to any disclaimer, the term of this patent is extended or adjusted under 35 U.S.C. 154(b) by 741 days.

(21) Appl. No.: 14/329,164

(22) Filed: Jul. 11, 2014

(65) Prior Publication Data

US 2016/0011252 A1 Jan. 14, 2016

(51) Int. Cl.
| | | |
|---|---|---|
| *G01R 31/08* | (2006.01) | |
| *G01R 31/02* | (2006.01) | |
| *H02H 3/04* | (2006.01) | |
| *H02H 7/26* | (2006.01) | |

(52) U.S. Cl.
CPC ......... *G01R 31/086* (2013.01); *G01R 31/021* (2013.01); *G01R 31/08* (2013.01); *G01R 31/088* (2013.01); *H02H 3/042* (2013.01); *H02H 7/26* (2013.01)

(58) Field of Classification Search
CPC .................................................. G01R 31/086
USPC .......................................................... 702/59
See application file for complete search history.

(56) References Cited

U.S. PATENT DOCUMENTS

| | | |
|---|---|---|
| 2005/0040809 A1 | 2/2005 | Uber et al. |
| 2005/0114048 A1 | 5/2005 | Choi et al. |
| 2008/0211511 A1 | 9/2008 | Choi et al. |
| 2008/0224546 A1 | 9/2008 | TeSelle et al. |
| 2011/0264388 A1 | 10/2011 | Gong et al. |
| 2012/0004867 A1 | 1/2012 | Mousavi et al. |
| 2012/0004869 A1 | 1/2012 | Saarinen et al. |
| 2012/0010830 A1 | 1/2012 | Saarinen et al. |

(Continued)

FOREIGN PATENT DOCUMENTS

| | | |
|---|---|---|
| EP | 1020729 A2 | 7/2000 |
| EP | 1172660 A2 | 1/2002 |
| EP | 2720332 A2 | 4/2014 |

OTHER PUBLICATIONS

Abdel-Akher, M., et al., "Fault Analysis of Multiphase Distribution Systems Using Symmetrical Components", IEEE Transactions on Power Delivery, Oct. 2010, pp. 2931-2939, vol. 25, No. 4, IEEE Power & Energy Society.

(Continued)

*Primary Examiner* — Ricky Ngon
(74) *Attorney, Agent, or Firm* — Taft Stettinius & Hollister LLP (57) ABSTRACT

A decision support system is provided for utility operations to assist with crew dispatch and restoration activities following the occurrence of a disturbance in a multiphase power distribution network, by providing a real-time visualization of possible location(s). The system covers faults that occur on fuse-protected laterals. The system uses real-time data from intelligent electronics devices coupled with other data sources such as static feeder maps to provide a complete picture of the disturbance event, guiding the utility crew to the most probable location(s). This information is provided in real-time, reducing restoration time and avoiding more costly and laborious fault location finding practices.

20 Claims, 6 Drawing Sheets

(56) References Cited

U.S. PATENT DOCUMENTS

| | | | | |
|---|---|---|---|---|
| 2012/0022713 A1* | 1/2012 | Deaver, Sr. | ............ | G05B 17/02 |
| | | | | 700/298 |
| 2012/0302271 A1 | 11/2012 | Stewart | | |
| 2013/0346011 A1* | 12/2013 | Ou | ............ | H02J 3/06 |
| | | | | 702/123 |
| 2014/0236503 A1* | 8/2014 | Sun | ............ | G01R 31/086 |
| | | | | 702/59 |
| 2014/0309952 A1* | 10/2014 | Sun | ............ | G01R 31/086 |
| | | | | 702/58 |
| 2015/0226781 A1* | 8/2015 | Sun | ............ | G01R 31/088 |
| | | | | 702/59 |

OTHER PUBLICATIONS

Grainger, et al., "Power System Analysis", McGraw-Hill International Editions, Electrical Engineering Series, Chapter 8 "The Impedance Model and Network Calculations", Chapter 12 "Unsymmetrical Faults", pp. 283, 470-479, 1994.

Kang, et al., "Systems and Methods for Faulted Segment Identification in Multiphase Power Systems", U.S. Appl. No. 61/913,218, filed Dec. 6, 2013.

Pereira, et al., "Improved Fault Location on Distribution Feeders Based on Matching During-Fault Voltage Sags", IEEE Transactions on Power Delivery, Apr. 2009, vol. 24, No. 2, pp. 852-862.

* cited by examiner

DECISION SUPPORT SYSTEM FOR OUTAGE MANAGEMENT AND AUTOMATED CREW DISPATCH

GOVERNMENT RIGHTS

This invention was made with Government support under Cooperative Agreement DE-OE0000547 awarded by the Department of Energy (DOE). The Government has certain rights in this invention.

TECHNICAL FIELD

The instant application relates to multiphase power distribution networks, and more particularly to outage management and crew dispatch for multiphase power distribution networks.

BACKGROUND

Electric power distribution systems are constructed either with overhead conductors or underground cables, but often composed of a combination of both. A distribution feeder is mainly composed of a circuit breaker, reclosers, line segments, busbars, service transformers, switches, and fuses. The topology of the distribution feeders typically has a fish-bone like structure to accommodate complex layouts of residential areas. The entire conductor length of a typical distribution feeder can stretch up to tens of miles or more, and comprise many small and large feeder segments. These lines are subject to short-circuit faults caused by insulation degradation, fallen trees, animal contact, etc. Following a fault, the utility company locates and isolates the fault, and dispatches a repair crew. This is often accomplished by patrolling the line emanating from the substation or towards the substation in search of the fault both for cause and location. The search process typically lasts hours and has an adverse impact on SAIDI (System Average Interruption Duration Index), which is a common reliability indicator used by electric power utilities.

One conventional outage management and crew dispatch method involves determining the location of a fault by placing a plurality of sensors on two or more branches of the power distribution system. The sensor can provide an indication if the fault current has passed through the corresponding branch e.g. by emitting detectable light or sound. When searching for the fault, the repair personnel follow the sensors which have indicated the fault path and locate the fault. The sensors have a unique identifier and can communicate to the control room the time of occurrence, so that the operator can locate the fault area and dispatch a repair crew.

In a second conventional approach, a distribution automation system includes a central control unit and feeder remote terminal units (RTUs) deployed along the lines. The RTUs receive measured voltage and current, compare the phase of a zero/positive-sequence voltage with the phase of a zero/positive-sequence current, and generate a fault indication when the phases satisfy certain conditions. When a fault occurs, the RTUs transmit the fault related information to the central control unit and the central control unit automatically identifies the faulty section and controls the open/closed status of the related RTUs to restore power to the healthy sections.

A third conventional approach discloses a control system that automatically identifies, locates, and isolates faults for a distribution system. The system includes a central computer and casings installed at pre-determined locations along the feeders. Each casing contains a radio transceiver, and an amplitude modulation (AM) detector. When a fault occurs, the two nearest AM detectors sense the radio noise produced by the fault and each sends a signal to the central computer. The central computer estimates the fault location by comparing the difference in the arrival time of the two signals. After the fault location is determined, the central computer sends a command to disconnect the two closest switches and isolate the faulted segment.

In each of these approaches, the faulted segment cannot be identified to the level between the two service transformers on the laterals. Another disadvantage is that they require extra devices on the feeder and the communication back to the control center.

Another conventional approach provides an impedance-based fault location method for a branched, non-homogeneous, and radial electric power distribution system. The fault location module is built within an intelligent electronic device (IED) and takes the voltage and current measurements from PTs (potential transformers) and CTs (current transformers) and calculates the reactance seen from the measuring point. The fault location module stores a look-up table with the reactance values from the substation to all buses in the feeder. By comparing the calculated reactance value with the values in the look-up table, multiple possible fault locations can be identified. If the IED can determine the fault type, the fault location module then removes the fault locations on the conductors that do not contain the faulted phases. Faulted circuit indicator information (FCIs) installed on the distribution system is communicated to the IED to further narrow down the candidate fault locations. However, this process is only applicable to radial networks. Furthermore, in order to narrow down the candidate fault locations, faulted circuit indicators information outside the substation are needed.

In another conventional approach, an algorithm which uniquely identifies the faulted node requires synchronized pre- and during-fault voltage and current phasors at the substation. The algorithm also requires voltage sag magnitudes recorded at selected IEDs along the feeder, which can be communicated back to the substation. The method sweeps all nodes in the network and performs load flow analysis iteratively for each node to calculate the voltage sags for the entire network. The true faulted node is the one that reveals the minimum difference between the calculated voltage sags and the measured sags. However, this approach is limited to radial topologies. Moreover, this method requires a detailed network model, load information, multiple IEDs deployed along the feeder and the communication link with the substation.

In systems with AMI (advanced metering infrastructure), the data from impacted meters must be retrieved, decrypted, aggregated, and analyzed on the AMI head-end. By design, multiple iterations are needed in what results as outage scoping analysis. Assuming all meters report timely and without failure, the end result is outage localization to the first protection component e.g. a fuse that operated to isolate the fault. When this information is available, the repair crew starts from that general area and, depending on the size and access/train characteristics of the area, may still take sizeable effort and time to finally narrow down the faulted segment.

SUMMARY

A method of identifying a disturbance in a multiphase power distribution network is provided. The multiphase power distribution network includes a substation and a plurality of feeders for distributing power downstream from the substation, each feeder including one or more three-phase main lines and a plurality of lateral lines isolatable from the corresponding main line by a protection device. The lateral lines have a plurality of segments each of which corresponds to a section of a lateral line terminated by a pair of physically-accessible nodes disposed along that lateral line. The method comprises constructing a connectivity model for the three-phase main lines and the lateral lines of the feeders, including the single-phase and double-phase lateral line segments. In case of a reduced connectivity model, the shunt capacitances of the line segments and the loads are not required. The connectivity model for each line segment comprises the physically-accessible nodes that terminate each line segment, a single, double or three phase designation for each line segment, and one or more characteristics of the protection device for the line segment. For each lateral line segment of the feeder for which the disturbance is detected, the method further comprises calculating short-circuit currents expected at one end of the feeder if the disturbance occurred at the physically-accessible nodes that terminate the lateral line segment, based on a fault model that indicates fault currents expected at the physically-accessible nodes under different fault conditions, and determining whether a current reported for the disturbance lies between the short-circuit currents. Each lateral line segment for which the reported current lies between the calculated short-circuit currents is identified as a potentially disturbed lateral line segment.

A corresponding system for identifying a disturbance in such a multiphase power distribution network comprises a first unit operable to construct a connectivity model for the three-phase main lines and the lateral lines of the feeders, including the single-phase and double-phase lateral line segments, the connectivity model for each line segment comprising the physically-accessible nodes that terminate each line segment, a single, double or three phase designation for each line segment, and one or more characteristics of the protection device for the line segment. The system further comprises a second unit operable to, for each lateral line segment of the feeder for which the disturbance is detected: calculate short-circuit currents expected at one end of the feeder if the disturbance occurred at the physically-accessible nodes that terminate the lateral line segment, based on a fault model that indicates fault currents expected at the physically-accessible nodes under different fault conditions; and determine whether a current reported for the disturbance lies between the short-circuit currents. The system also comprises a third unit operable to identify each lateral line segment for which the reported current lies between the calculated short-circuit currents as a potentially disturbed lateral line segment.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings:

FIG. 3, which includes

DETAILED DESCRIPTION

According to the embodiments described herein, a disturbance management system and corresponding method are provided for assisting utility operations with crew dispatch and restoration activities following the occurrence of a disturbance in a multiphase power distribution network. The term 'disturbance' as used herein refers to an event that may have caused a fault or eventually lead to a fault in a multiphase power distribution network. For example, a disturbance can be a fault which has caused an outage, a fault which has yet to cause an outage but may lead to an outage if left unmitigated, abnormal switching transients, etc. In each case, a real-time visualization of possible segments affected by the disturbance is provided. This includes faults that are normally missed in SCADA (supervisory control and data acquisition) such as fuse-cleared faults that cause no breaker trips.

The disturbance management system uses real-time data from intelligent electronics devices (IED) coupled with other data sources such as static feeder maps to provide a complete picture of the disturbance event, guiding the utility crew to the most probable location(s). This information is provided in real-time to the utility crew in the field, reducing restoration time and avoiding more costly and laborious conventional fault identification practices.

The information used by the disturbance management system can be gathered from other real-time systems that extract the signature of a disturbance from IED waveforms, perform automated event analysis and output relevant information as to event zone, duration, disturbance type (in the embodiments that follow, fault is referred to as an example of a disturbance), event type, impacted phase(s), fault clearing device, and one or more characteristics of the fault clearing device (if applicable). By integrating temporal and spatial feeder information, the utility operator and field crew can relate real-time event reports with a particular section or component of the feeder and dispatch a crew for restoration and troubleshooting.

The system and corresponding method disclosed herein advantageously do not require up-front heavy infrastructure investment. The system gathers as-operated feeder connectivity information and builds a corresponding feeder connectivity model. The system also utilizes current measurements from the feeder head IEDs and the feeder connectivity model to generate a list of potential faulted segment(s). The system leverages the event analysis result from a real-time system e.g. which performs automated event analysis based in the substation, and further reduces the number of potential faulted segment(s). The resulting potential faulted segment(s) can be visualized for inspection by a repair crew.

Figure 1:
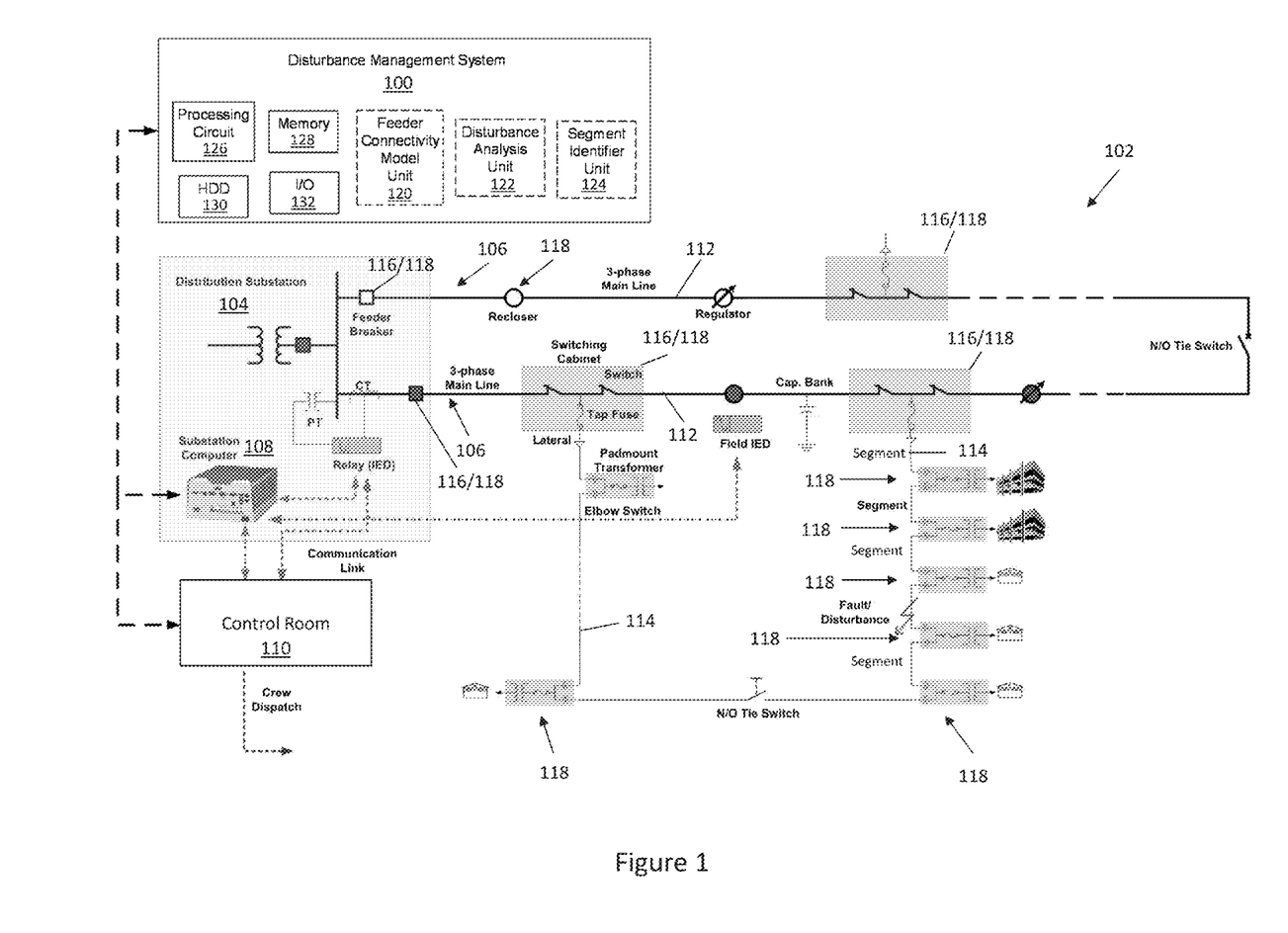
FIG. 1 illustrates a block diagram of an embodiment of a disturbance management system for multiphase power distribution networks.

FIG. 1 illustrates an embodiment of a disturbance management system 100 for identifying a disturbance that may have caused a fault in a multiphase power distribution network 102. The multiphase power distribution network 102 includes a substation 104 and a plurality of feeders 106 for distributing power downstream from the substation 104. The disturbance management system 100 can be deployed at a substation computer 108 or a computer in a control room 110 of the multiphase power distribution network 102. Each feeder 106 of the multiphase power distribution network 102 includes one or more three-phase main lines 112 and a plurality of lateral lines 114 isolatable from the corresponding main line 112 by a protection device 116. Some protection devices 116 can be used to isolate a lateral line 114 from the corresponding main line 112 e.g. in the case of a fuse. Other protection devices 116 can be a circuit breaker or recloser that protects the main line 112. Both protection device types (i.e. lateral line and main line protection devices) are shown in FIG. 1. In each case, the lateral lines 114 have a plurality of segments each of which corresponds to a section of a lateral line 114 terminated by a pair of physically-accessible nodes 118 such as service transformers or cabinets disposed along that lateral line 114. The main lines 112 can be similarly segmented by pairs of physically-accessible nodes 118 on the main lines 112. The system 100 comprises a first (feeder connectivity model) unit 120 for constructing a connectivity model for the three-phase main lines 112 and the lateral lines 114 of the feeders 106, including the single-phase and double-phase lateral line segments. The connectivity model for each line segment comprises the physically-accessible nodes 118 that terminate each line segment, a single, double or three phase designation for each line segment, and one or more characteristics of the protection device 116 for the line segment. In the case of a reduced connectivity model, the shunt capacitances of the line segments and the loads are not required as is explained in more detail later herein.

The disturbance management system 100 also comprises a second (disturbance analysis) unit 122. For each lateral line segment of the feeder 106 for which the disturbance is detected, the second unit 122 calculates short-circuit currents expected at one end of the feeder 106 if the disturbance occurred at the physically-accessible nodes 118 that terminate the lateral line segment, based on a fault model that indicates fault currents expected at the physically-accessible nodes 118 under different fault conditions, and determines whether a current reported for the disturbance lies between the short-circuit currents. A third (segment identifier) unit 124 of the system 100 identifies each lateral line segment for which the reported current lies between the calculated short-circuit currents as a potentially disturbed lateral line segment.

The disturbance management system 100 has remote or direct access to the substation computer 108 and/or the control room computer 110. The disturbance management system 100 further comprises a processing circuit 126 which can include digital and/or analog circuitry such as one or more controllers, processors, ASICs (application-specific integrated circuits), etc. for executing program code which performs the disturbance identification and restoration operations described herein. The first, second and third units 120, 122, 124 of the disturbance management system 100 are included in or associated with the processing circuit 126 for performing the disturbance identification and restoration operations. The disturbance management system 100 also has one or more storage media such as DRAM (dynamic random access memory) 128 and an HDD (hard disk drive) and/or other mass storage device 130 for storing the program code and related data processed and accessed by the processing circuit 126, first unit 120, second unit 122, and third unit 124 during execution of program code. The storage medium also stores the results generated by the disturbance management system 100. The disturbance management system 100 also includes I/O (input/output) circuitry 132 for communicating with the substation computer 108 and/or control room computer 110.

The disturbance management system 100 leverages data from IEDs and a real-time analysis system based in the substation 104 for fault location and visualization in real-time. In the case of a lateral fault i.e. a fault on a lateral line 114, the disturbance identification and restoration functions implemented by the disturbance management system 100 can direct the repair crew to the faulted segment on the level between two service transformers 118 on the faulted lateral line 114. The disturbance identification function described herein is applicable to radial and mesh multiphase power distribution networks, and as such is amenable to feeder topologies involving multiple generation resources or DERs (distributed energy resources).

Standard real-time analysis systems allow for substation-based automated event analysis regardless of whether the disturbance event is detectable in SCADA. Such real-time analysis systems communicate with feeder IEDs which retrieve voltage and current samples from PTs (Potential Transformers) and CTs (Current Transformers) and store a pre-specified number of samples in local memory. When a disturbance is detected, the event data is sent in a preferred format e.g. COMTRADE (common format for transient data exchange for power systems) to the substation computer 108. The real-time analysis system watches for new COMTRADE or similar files. Once a new set of disturbance records is retrieved, the real-time analysis system automatically begins event analysis.

For example, some real-time analysis systems extract the signature of the current waveforms, compare the extracted signal with a knowledge base and output the following information associated with the disturbance event: zone; duration; fault type; event type; impacted phase(s); fault clearing device (if applicable), and fault clearing device characteristic(s) (if applicable). The zone of the disturbance event is typically classified into three categories: PMZ (primary monitoring zone); AMZ (adjacent monitoring zone); and UMZ (upstream monitoring zone). If the disturbance was predicted to have occurred on the feeder 106 monitored by the IED, the zone is PMZ. If the disturbance was predicted to have occurred on the adjacent feeder 106 not directly monitored by the IED, the zone is AMZ. If the disturbance was predicted to have occurred on the upstream transmission lines (not shown) connected to the distribution substation 104, the zone is UMZ.

Standard real-time analysis systems also classify disturbance events based on their nature. This may include standard classifications such as feeder fault, inrush/load pick-up, switching transient, upstream event, etc. where the term 'upstream event' refers to the disturbance event that has occurred on the upstream transmission lines connected to the distribution substation 104. For PMZ disturbance events with 'feeder faults' as the event type, the clearing device 116 can also be predicted along with its characteristic(s) where applicable. For example, if a fuse blows, a determination is made as to the size and time-to-open of the fuse. In other cases, a circuit breaker or recloser may be the clearing device 116 on the corresponding main line 112. Standard real-time analysis systems send a real-time notification e.g.

via email or text to the operator containing the event analysis result and disturbance waveforms and simultaneously updates a website containing the same information hosted by the substation computer 108. The operator can subsequently visit the website later for off-line analysis.

The disturbance management system 100 described herein utilizes the capabilities of a standard real-time analysis system as a decision support system for assisting the operator with crew dispatch and restoration by providing real-time fault location and visualization. For example, the first unit 120 of the disturbance management system 100 obtains connectivity data files associated with a faulty feeder 106 at the time of failure e.g. from an OMS (outage management system) and establishes a feeder connectivity model e.g. in the form of a table or database. The connectivity data files from an OMS typically contain certain logical relationships such as upstream/downstream, of all the components on the primary side of the feeder 106 including circuit breaker, reclosers (including open/closed status), fuses (including characteristics and open/closed status), switches (including open/closed status), service transformers, busbars and line segments (including phase designation, length, conductor size, conductor material), etc. The first unit 120 of the disturbance management system 100 traces the connectivity data files and builds a feeder connectivity model which contains only line segments. In building the segment-only feeder connectivity model, busbars, circuit breaker and closed reclosers/switches/fuses are considered as an electrical point. Open reclosers/switches/fuses are treated as an open point. Service transformers, which are shunt elements, are ignored. The resulting feeder connectivity model is reflected in a table, database, etc. e.g. where each row represents a line segment and the columns convey certain information related to the line segment. In a purely illustrative example, the first column can contain a unique identifier of the line segment and the remaining columns can contain the following information pertaining to the line segment: first terminal (physically-accessible) node; second terminal (physically-accessible) node; length; conductor size; conductor material; phase designation; protection device (e.g. fuse or circuit breaker), and the protection device characteristic(s) e.g. if the protection device were a fuse.

The disturbance management system 100 also implements a faulted segment identification (FSI) method for locating faulted segments not only on the three-phase main lines 112 but also on single-phase and double-phase laterals 114. The process to restore service following a confirmed fault includes fault location, isolation, and service restoration (FLISR). Although not explicit, the restoration process does require that the faulted segment be known. This is a relaxed requirement over fault location i.e. distance to fault in which as opposed to pinpointing the fault, the faulted segment between two switches is identified for isolation purposes.

Figure 2:
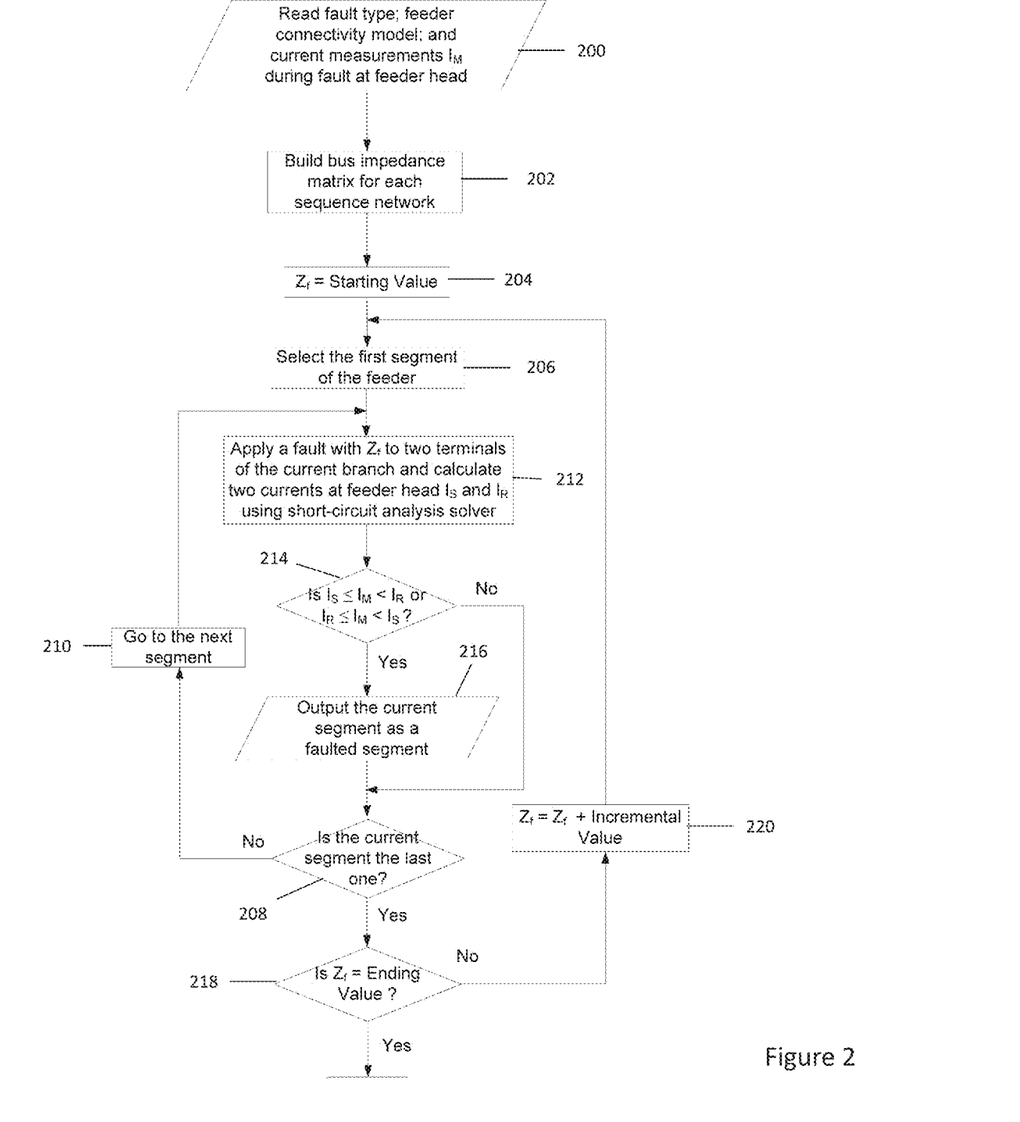
FIG. 2 illustrates a flow diagram of an embodiment of a method of identifying potentially disturbed segments in a multiphase power distribution network.

FIG. 2 illustrates an embodiment of the FSI method implemented by the disturbance management system 100. The disturbance management system 100 executes the FSI method according to this embodiment when the zone is PMZ and the disturbance event type is 'feeder fault'. Once determined to execute, the second unit 122 of the disturbance management system 100 reads the current measurements, the event analysis result from the real-time analysis system based in the substation 104 and the feeder connectivity model generated by the first unit 120 of the disturbance management system 100 (Block 200). Upon completion of the FSI method, a list of potentially disturbed segments is outputted e.g. in a text file. For each potentially disturbed segment, the following information is provided: unique identifier; fault impedance range; phase designation; protection device; and protection device characteristic(s) (if applicable).

The disturbance management system 100 extends symmetrical component fault analysis to multiphase power distribution networks by establishing equivalent three-phase line models for the multiphase (single-phase, two-phase, and three-phase) line segments using dummy nodes and dummy lines. The shunt capacitances of the lines and loads are ignored in a reduced complexity network model. Sequence networks are a concept used in power system analysis. When a three-phase conductor is described, there are mutual couplings between each of the phases. So to build the bus impedance matrix for the entire network, the mutual couplings between the phases must be considered, which is complex. In symmetrical component theory, a transformation matrix is provided for decoupling the three-phase conductor into three independent conceptual single-phase conductors. When all single-phase conductors are connected, a single-phase sequence network is formed. So the original 3-phase network is now decoupled to three independent 1-phase sequence networks. It is much easier to build a bus impedance matrix for a single-phase sequence network, because the mutual couplings between phases become negligible and are ignored. The three independent sequence networks are conventionally named positive-, negative- and zero-sequence networks. Once decoupled into three independent sequence networks, the bus impedance matrix can be built for each single-phase sequence network. Well-established sequence-domain short-circuit analysis then can be utilized to calculate the currents everywhere in the network.

After obtaining the equivalent three-phase sequence impedances for all the line segments (three-phase, double-phase, or single-phase), the second unit 122 of the disturbance management system 100 constructs a bus impedance matrix for each sequence network (Block 202). Having the bus impedance matrix for each sequence network $Z^{(i)}$ (i=0, 1,2 for zero-, positive-, and negative-sequence quantities), standard sequence-domain fault analysis techniques can be applied. For example, the zero-, positive-, and negative-sequence fault currents $I_f^{(0)}$, $I_f^{(1)}$, $I_f^{(2)}$ flowing out of the faulted node for typical fault types are shown in Table I below.

TABLE I

Fault Currents for Different Short-circuit Faults

| Fault Type | $I_f^{(1)}$ | $I_f^{(2)}$ | $I_f^{(0)}$ |
|---|---|---|---|
| AG | $\dfrac{V_f}{Z_{kk}^{(0)} + Z_{kk}^{(1)} + Z_{kk}^{(2)} + 3Z_f}$ | $I_f^{(1)}$ | $I_f^{(1)}$ |
| BCG | $\dfrac{V_f}{Z_{kk}^{(1)} + \dfrac{Z_{kk}^{(2)}(Z_{kk}^{(0)} + 3Z_f)}{Z_{kk}^{(2)} + Z_{kk}^{(0)} + 3Z_f}}$ | $\dfrac{Z_{kk}^{(1)} I_f^{(1)} - V_f}{Z_{kk}^{(2)}}$ | $\dfrac{Z_{kk}^{(1)} I_f^{(1)} - V_f}{Z_{kk}^{(0)} + 3Z_f}$ |
| ABC(G) | $\dfrac{V_f}{Z_{kk}^{(1)} + Z_f}$ | 0 | 0 |
| BC | $\dfrac{V_f}{Z_{kk}^{(1)} + Z_{kk}^{(2)} + Z_f}$ | $-I_f^{(1)}$ | 0 |

Figure 3A:
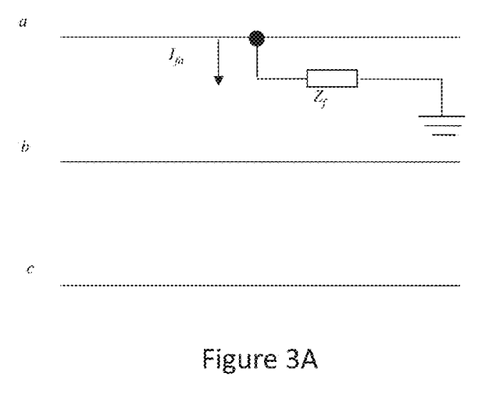
FIGS. 3A through 3D, illustrates fault impedance models for different types of line faults in a multiphase power distribution network.
Figure 3B:
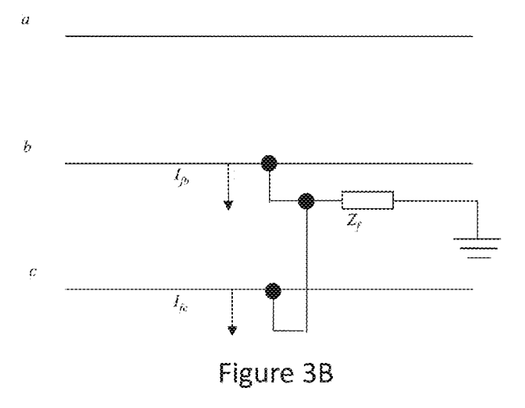
Figure 3C:
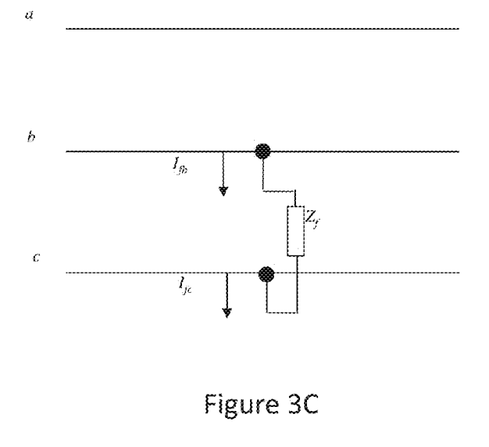
Figure 3D:
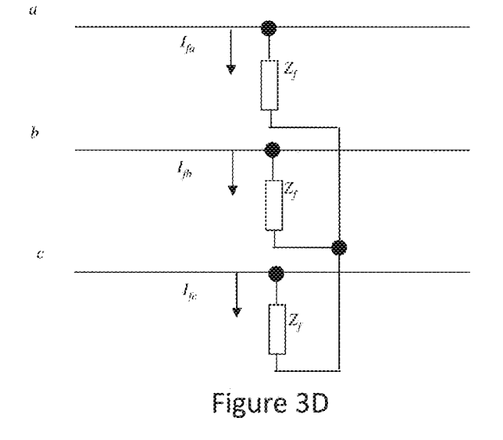

In Table I, the variable k denotes the faulted node, $Z_f$ denotes the fault impedance, and $V_f$ represents the pre-fault positive-sequence voltage at the faulted node and it is assumed to be 1.0 p.u. $Z_{kk}^{(i)}$ signifies the $k^{th}$ diagonal element of the $i^{th}$ sequence bus impedance matrix. The fault impedance models for different types of disturbances are shown in FIG. 3. FIG. 3A shows phase a faulted to ground. FIG. 3B shows phases b and c both faulted to ground. FIG. 3C shows phase b faulted to phase c. FIG. 3D shows all three phases faulted to one another.

The voltages and currents during fault throughout the network 102 can be calculated including those at the feeder heads 106 connected to the substation 104. Using RMS (root mean square) current magnitudes from the feeder head IED, the disturbance management system 100 implements the faulted segment identification method. For example, the second unit 122 of the disturbance management system 100 reads the feeder connectivity model generated by the first unit 120 and calculates equivalent sequence line parameters using any standard approach for all line segments including the single-phase and double-phase lines. Next, the second unit 122 builds a bus impedance matrix for each sequence network. The second unit 122 also reads the fault type from the event analysis result, which will be utilized in the short-circuit analysis performed by the second unit 122.

The second unit 122 of the disturbance management system 100 sweeps all segments along the feeder 106 being analyzed, including main line segments and lateral line segments, and applies a fault with a fault impedance of certain value $Z_f$ on each node (Blocks 204, 206, 208, 210). For each specific fault impedance and at each node, depending on the fault type, the second unit 122 calculates the currents at the feeder head using the standard short-circuit modeling and analysis approach previously described herein (212). That is, the second unit 122 simulates the detected disturbance with a fault impedance ($Z_f$) at each node terminating each line segment and calculates the short-circuit currents expected at one or more select locations for each node in the circuit.

For each feeder segment, the two sets of calculated current magnitudes at the feeder head from the two terminal nodes of the current segment are denoted as $I_S$ and $I_R$. If the RMS current magnitudes $I_M$ reported by the IED during the fault lies between $I_S$ and $I_R$, then corresponding segment between the two nodes is regarded as a potentially disturbed segment given the corresponding fault impedance (Blocks 214, 216). Since the fault impedance is never known, a plausible range (e.g. 0 to 10 ohms) with an incremental step e.g. 0.5 ohms is used to vary the fault impedance (Blocks 218, 220). That is, the second unit 122 can simulate the detected disturbance over a range of fault impedances at each node in the circuit. This approach yields a superset containing potentially disturbed segments, e.g. outputted in a text file. For each potentially disturbed segment, the following information can be provided: unique identifier; fault impedance range; phase designation; protection device type; and protection device characteristic(s) (if applicable).

As part of the FSI method, the disturbance management system 100 can update the source impedance of the substation 104 to ensure accuracy of the FSI method. The substation equivalent source impedance is the result of the division of the pre-fault steady-state voltage by the short-circuit fault current conducted at the substation 104. For each fault event, the pre-fault steady-state voltage can be updated with a few steady-state cycles prior to the fault itself which are usually captured by the corresponding IED. The substation short-circuit fault currents can be updated once a new test is conducted.

Previously described herein is a scenario where measurements are only required from the feeder head. This scenario is typical for a radial network.

Figure 4:
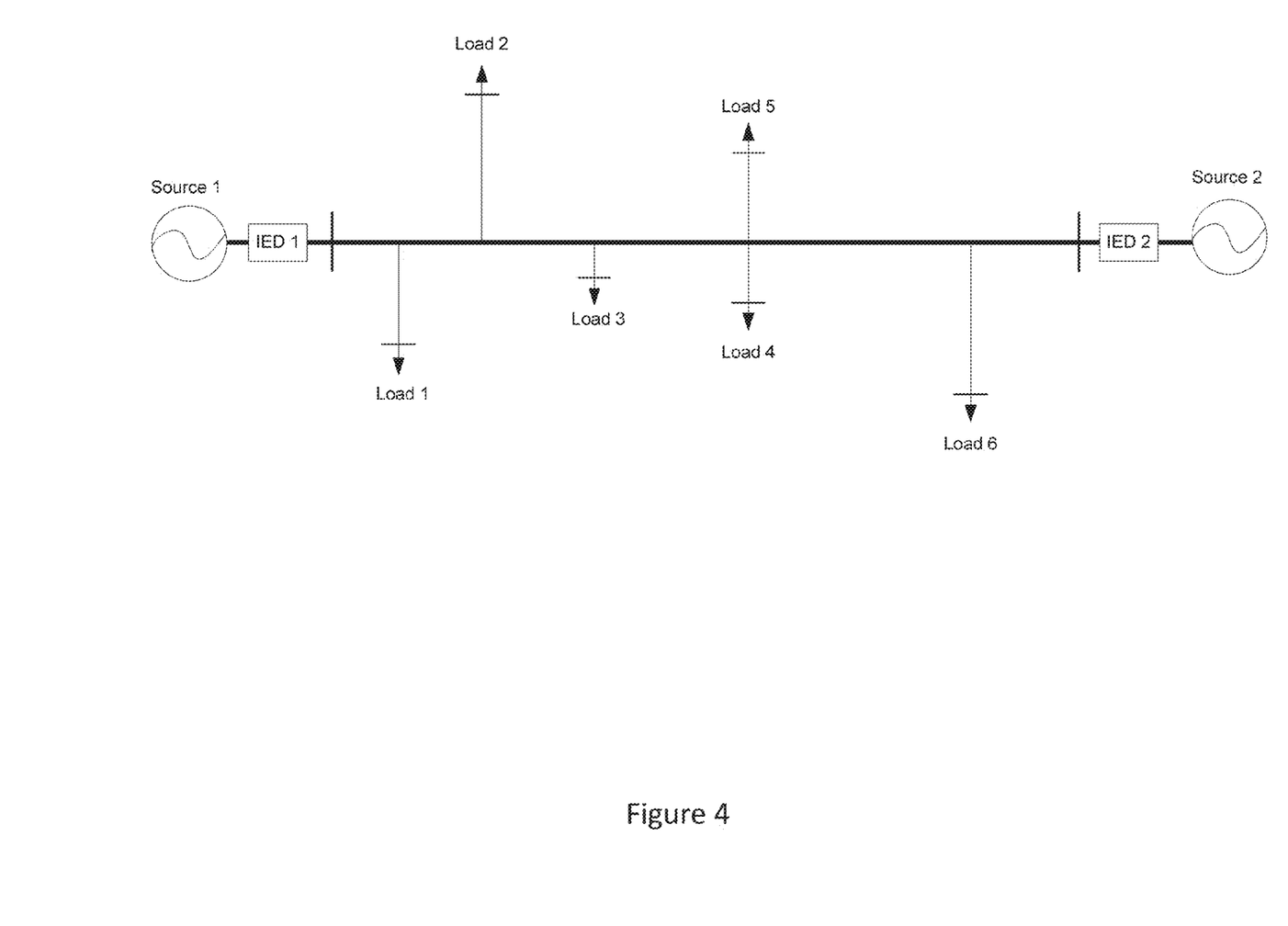
FIG. 4 illustrates a block diagram of a feeder of an exemplary mesh network.

FIG. 4 illustrates a feeder of an exemplary mesh network. The mesh network has at least two generation resources (Source 1, Source 2) feeding the network, and current measurements $I_{M_1}$ and $I_{M_2}$ from the generation resources are usually available. For each segment, applying a fault at two terminal nodes, the short-circuit currents $I_{S_1}$ and $I_{R_1}$ for the first measuring branch and $I_{S_2}$ and $I_{R_2}$ for the second measuring branch can be calculated. Only when $I_{M_1}$ lies between $I_{S_1}$ and $I_{R_1}$ and $I_{M_2}$ lies between $I_{S_2}$ and $I_{R_2}$, is the corresponding segment be considered a potentially disturbed segment. Owing to the additional measurements, fewer candidate segments are produced and identified as potentially disturbed with a one-measurement scenario typical for radial networks. The proposed faulted segment identification methodology described herein can be extended to mesh networks with multiple generation resources as described above.

The disturbance management system 100 can reduce the list of potentially disturbed segments, e.g. by leveraging the capabilities of the real-time analysis system based in the substation 104 and that performs the automated event analysis previously described herein.

Figure 5:
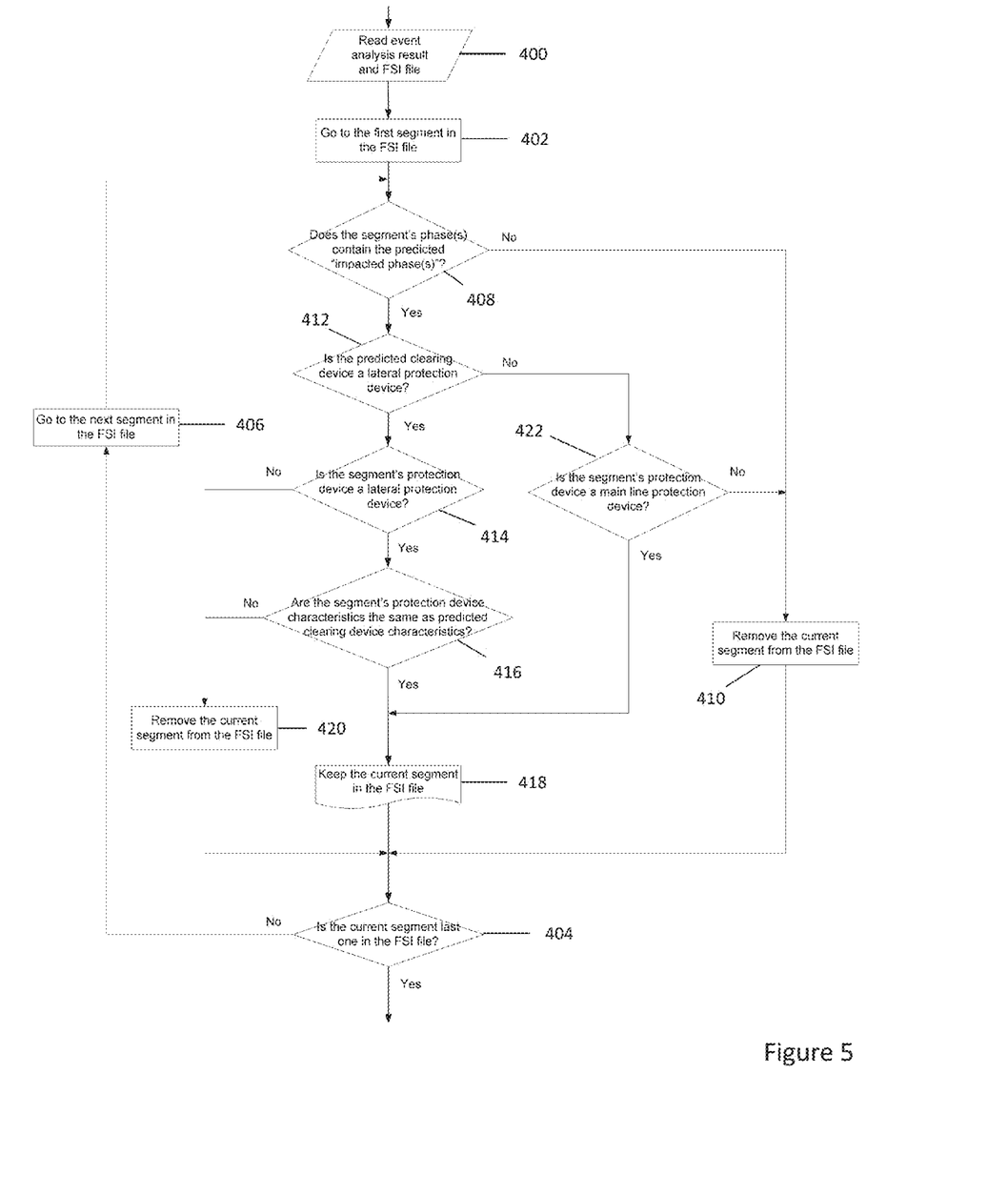
FIG. 5 illustrates a flow diagram of an embodiment of a method of reducing a list of potentially disturbed segments in a multiphase power distribution network to a candidate set for inspection by a dispatch crew.

FIG. 5 illustrates an embodiment of a method of reducing the list of potentially disturbed segments generated by the second unit 122 of the disturbance management system 100. According to this embodiment, the third unit 124 of the disturbance management system 100 inputs the FSI result and excludes certain ones of the potentially disturbed segments. More particularly, the third unit 124 loops through all potentially disturbed segments identified by the second unit 122 and analyzes each segment (Blocks 400, 402, 404, 406). For the potentially disturbed segment currently under analysis, if the phases of that segment include all of the predicted impacted phases, then the third unit 124 continues on to verify the predicted clearing device (Block 408). For example, if the predicted impacted phase is phase a, as long as the line segment under analysis contains phase a, that line segment will be further scrutinized as a possible candidate for inspection by a dispatch crew. In this example, the phasing of the potentially disturbed segment could be a, ab or abc, and in each case the segment will be further scrutinized. Otherwise, the potentially disturbed segment under analysis is eliminated as a candidate for inspection by a dispatch crew (Block 410).

The predicted clearing device 116 can be a main line protection device such as a circuit breaker/recloser or a lateral line protection device such as a fuse. For line segments, if the predicted clearing device 116 is a lateral line protection device and if the protection device of the potentially disturbed line segment under analysis has the same type as the predicted protection device (Blocks 412, 414), the third unit 124 of the disturbance management system 100 verifies if the characteristic(s) (e.g. size, time-to-open, etc.,) of the protection device 116 of the potentially disturbed line segment match the predicted characteristic(s) (Block 416). For example, the predicted clearing device 116 can be a fuse having particular characteristics. If the characteristics of the line protection device 116 of the potentially disturbed line segment under analysis are the same as the predicted characteristic(s) or within a specified range, then that potentially disturbed line segment remains a candidate for inspection by a dispatch crew (Block 418). Otherwise, the potentially disturbed line segment is eliminated as a candidate for inspection (Block 420). If the predicted protection device 116 is a main line protection device such as a circuit breaker and if the protection device of the potentially disturbed line segment under analysis matches the predicted type of protection device, then that potentially disturbed line segment remains a candidate for inspection by a dispatch crew (Blocks 422, 418). Otherwise, that potentially disturbed line segment is eliminated as a candidate for inspection (Blocks 422, 410). The third unit 124 of the disturbance management system 100 repeats the candidate verification process for each potentially disturbed segment identified by the third unit 124 of the disturbance management system 100 until all of the potentially disturbed segments have been analyzed (Blocks 404, 406).

In general, the process determines whether the predicted clearing device is a lateral protection device or a main line protection device. In the case of a lateral protection device, the process then examines the protection device of the line segment currently under analysis. If this protection device matches the predicted one, the process further examines one or more characteristics of the protection device such as size, time-to-open, etc. The process knows the current line segment under analysis is a lateral line segment because it has a lateral protection device association. But if the protection device of line segment currently under analysis does not match the predicted lateral protection device, the process knows that the current line segment is a main line and should be filtered out. On the other hand, in case the predicted protection device is a main line protection device, the process analyzes the protection device of the line segment currently under analysis. If the protection devices do not match, the current line segment is a lateral line segment and is filtered out from further consideration. If the protection devices do match, the current line segment is a main line and is kept in the FSI result file.

The disturbance management system 100 can implement a visualization of the candidate list of potentially disturbed segment(s) e.g. on Google maps or any other preferred mapping software on computers or mobile devices. For example, the disturbance management system 100 uses the FSI output of the candidate verification process and the GIS (geographic information system) shape files of the faulty feeder 106. GIS shape files include layers corresponding to segments, transformers, fuses, switches, circuit breaker, reclosers, busbars, etc. GIS shape files contain the latitude and longitude coordinates of all feeder elements. By searching the unique identifier of a potentially disturbed segment in the FSI file within the GIS segment layer, the disturbance management system 100 can acquire the latitude and longitude coordinates for all of the potentially disturbed segment(s) identified in the FSI file. The disturbance management system 100 then converts the FSI file e.g. into a KML (keyhole markup language) or other type of file, which can be viewed on Google maps or other visualization application in a browser. In addition, the disturbance management system 100 converts all GIS shape files from the faulty feeder 106 into another KML file. Importing both KML files in a browser enables the visualization of the potentially disturbed segment(s) overlaid on a feeder map. For example, the potentially disturbed segment(s) can be a different color than the other segments to better highlight the potentially disturbed segment(s). The synthesized map can be shown on the same website that displays the captured waveforms and event analysis result from the real-time analysis system based in the substation 104. The operator can dispatch a repair crew to the most likely location(s) for the disturbance based on the map. The crew in the field can also view the maps on their mobile devices to speed up the restoration process.

Figure 6:
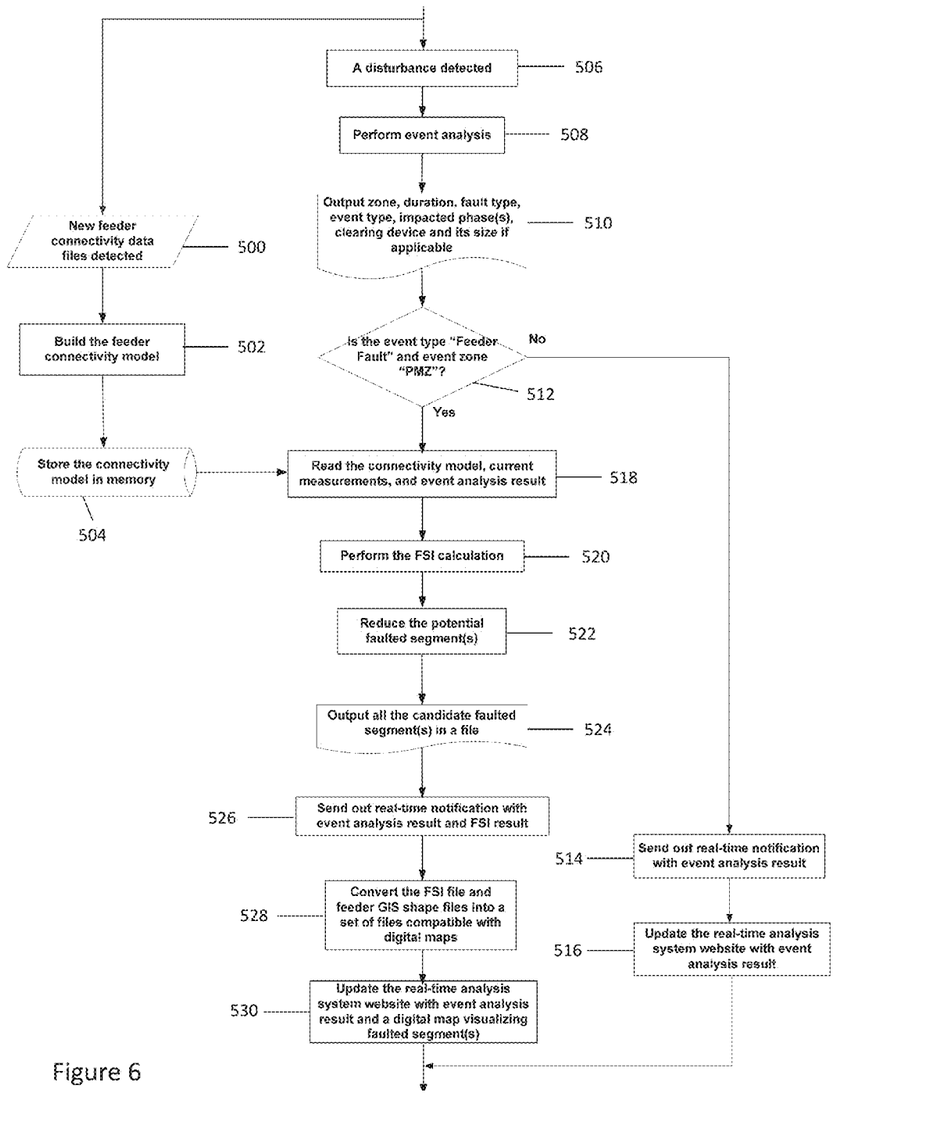
FIG. 6 illustrates a flow diagram of an embodiment of a disturbance identification and restoration method for multiphase power distribution networks.

FIG. 6 illustrates an embodiment of a method of dispatching a crew in response to a disturbance event. The disturbance management system 100 can be triggered either by detecting a new disturbance or new feeder connectivity data files. Once the new feeder connectivity data files are detected (Block 500), the first unit 120 of the disturbance management system 100 builds the feeder connectivity model (Block 502) and stores the model in the memory (Block 504) as previously described herein. For another thread of the process, once a disturbance is detected (Block 506), a standard real-time analysis system performs automated event analysis (Block 508) and outputs information relating to the disturbance event such as disturbance zone, duration, fault type, event type, impacted phase(s), clearing device and characteristic(s) if applicable (Block 510) as previously described herein.

If the disturbance event meets the following two criteria it is defined as a qualified event: event type='feeder fault' and zone='PMZ' (Block 512). If the disturbance event is not qualified, the disturbance management system 100 directly sends out a real-time email notification to the operator containing the event analysis result (Block 514) and immediately updates the real-time analysis website with the event analysis result and disturbance waveforms (Block 514). If the disturbance event is qualified, the second unit 122 of the disturbance analysis system 100 reads the feeder connectivity files stored in memory and acquires current measurements and the event analysis result from the real-time analysis system (Block 518). The second unit 122 then performs the FSI analysis as previously described herein to identify potentially disturbed segment(s) (Block 520). The third unit 124 of the disturbance analysis system 100 reduces the list of potentially disturbed segments provided by the second unit 122, to provide a candidate list of potentially disturbed segments for inspection by a dispatch crew also as previously described herein (Block 522). For example, the candidate list of potentially disturbed segments can be outputted in a text file (Block 524). The disturbance management system 100 sends a real-time notification e.g. via an email or text service to the operator containing the event analysis result and the candidate list of potentially disturbed segments (Block 526). The disturbance management system 100 can convert a text file that contains the FSI results and a corresponding GIS shape file into KML files as previously described herein (Block 528), and updates the real-time analysis website with the event analysis result, disturbance waveforms and the candidate list of potentially disturbed segments overlaid on a feeder map for easy visual inspection by the dispatch crew (Block 530).

The disturbance identification and restoration techniques described herein identify disturbed segment(s) for unbalanced distribution systems including single-phase and double-phase laterals. The granularity of the result is at the level of a segment section between two physically-accessible nodes such as two service transformers on the laterals. The disturbance identification and restoration techniques described herein are applicable to both radial and mesh networks with multiple generation resources or distributed energy resources. The RMS current measurements can be captured from any or all of the generation resources that feed the network. The disturbance identification and restoration techniques described herein leverage data from existing IEDs deployed at the feeder heads and do not require any additional devices and communication links from outside the substation, demanding less time and capital cost to deploy. During operation, the disturbance identification and restoration techniques described herein provide a faster solution because information does not need to be gathered from the field which may easily cause computational delay. Moreover, the disturbance identification and restoration techniques described herein are reliable and safe in that they do not rely on information from field devices which may be corrupted, hacked or simply not available. In the long run, the disturbance identification and restoration techniques described herein save utility company cost induced by maintaining the field devices and communication links. Also, the disturbance identification and restoration techniques described herein provide a real-time visualization of the potentially disturbed segments accessible from anywhere. The operator can access a corresponding map from the control room to easily dispatch the correct crew for restoration and troubleshooting. For example, the crew in the field can conveniently locate the most probable disturbance location(s) by viewing the map from a browser on their mobile devices.

The disturbance identification and restoration techniques described herein provide a sequence-domain based fault location method applicable to unbalanced multiphase distribution systems, e.g. by formulating 3 sequence networks for all three-phase main line segments and single/double-phase laterals described with the corresponding sequence-domain impedance values. A bus impedance matrix is then built for each sequence network. Conventional sequence-domain based short-circuit analysis is applied to each node in the network. A segment can be regarded as potentially disturbed if the actual measurements lie between the two sets of calculated currents from the two terminals of the segment. As a result, the method yields a list of potentially disturbed segments that covers single-phase and double-phase laterals where the majority of faults occur.

The disturbance identification and restoration techniques described herein also utilize the capabilities of a standard real-time analysis system which leverages data from existing IEDs deployed at the feeder heads and conducts automated event analysis. The disturbance identification and restoration techniques described herein utilizes the event analysis result including impacted phase(s), clearing device and clearing device characteristic(s) to filter out certain ones of the potentially disturbed segments. In other words, only the segments whose phase designation contains the impacted phase(s) and whose protection device and protection device characteristic(s) (if applicable) match those predicted by the event analysis are kept. The disturbance identification and restoration techniques described herein provide a significant reduction in the number of candidate fault locations and do not require installations and communications of sensors or IEDs along the feeders.

Terms such as "first", "second", and the like, are used to describe various elements, regions, sections, etc. and are not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of identifying a disturbance in a multiphase power distribution network which includes a substation and a plurality of feeders for distributing power downstream from the substation, each feeder including one or more three-phase main lines and a plurality of lateral lines isolatable from the corresponding main line by a protection device, the lateral lines having a plurality of segments each of which corresponds to a section of a lateral line terminated by a pair of physically-accessible nodes disposed along that lateral line, the method comprising:

constructing a connectivity model for the three-phase main lines and the lateral lines of the feeders, including the single-phase and double-phase lateral line segments, the connectivity model for each line segment comprising the physically-accessible nodes that terminate each line segment, a single, double or three phase designation for each line segment, and one or more characteristics of the protection device for the line segment;

for each lateral line segment of the feeder for which the disturbance is detected:

calculating short-circuit currents expected at one end of the feeder if the disturbance occurred at the physically-accessible nodes that terminate the lateral line segment, based on a fault model that indicates fault currents expected at the physically-accessible nodes under different fault conditions; and determining whether a current reported for the disturbance lies between the short-circuit currents;

identifying each lateral line segment for which the reported current lies between the calculated short-circuit currents as a potentially disturbed lateral line segment; and restoring service for at least one of the potentially disturbed lateral line segments.

2. The method of claim 1, further comprising determining the fault model by:

determining three sequence networks for the multiphase power distribution network that contains single-phase, double-phase and three-phase line segments;

determining three bus impedance matrices for each sequence network;

simulating the detected disturbance with a fault impedance at each node terminating each line segment; and calculating the short-circuit currents expected at one or more select locations for each node in the circuit.

3. The method of claim 2, wherein the detected disturbance is simulated over a range of fault impedances at each node in the circuit, and wherein each lateral line segment for which the reported current lies between the short-circuit currents for any fault impedance in the range of fault impedances is identified as a potentially disturbed lateral line segment.

4. The method of claim 3, wherein the detected disturbance is simulated for each lateral line segment of the feeder for which the disturbance is detected at a plurality of incremental impedance values between a starting value of the range of fault impedances and an ending value of the range of fault impedances.

5. The method of claim 1, wherein, the multiphase power distribution network includes power generation sources at first and second ends of one or more of the feeders, wherein the short-circuit currents are calculated at the first and second ends of the feeder for each lateral line segment of a feeder having power generation sources at both ends, wherein a current is reported for the disturbance at the first and second ends of the feeder, and wherein each lateral line segment for which the reported current at the first end of the feeder lies between the short-circuit currents calculated for the first end of the feeder and the reported current at the second end of the feeder lies between the short-circuit currents calculated for the second end of the feeder is identified as a potentially disturbed lateral line segment.

6. The method of claim 1, further comprising:
for each potentially disturbed lateral line segment, identifying:
the phase designation for the potentially disturbed lateral line segment;
the type of protection device connected to the lateral line of the potentially disturbed lateral line segment; and
one or more characteristics of the protection device if the protection device is a lateral protection device.

7. The method of claim 6, further comprising:
eliminating a potentially disturbed lateral line segment as a candidate for inspection by a dispatch crew if the phase designation of the potentially disturbed lateral line segment does not include all phases affected by the disturbance.

8. The method of claim 6, further comprising:
eliminating a potentially disturbed lateral line segment as a candidate for inspection by a dispatch crew if the type of protection device for the potentially disturbed lateral line segment does not match the type of protection device predicted to have cleared the disturbance.

9. The method of claim 6, wherein the predicted protection device is a lateral protection device having one or more predetermined characteristics, the method further comprising:
eliminating a potentially disturbed lateral line segment as a candidate for inspection by a dispatch crew if the one or more characteristics of the protection device for the potentially disturbed lateral line segment do not match the one or more predetermined characteristics of the predicted lateral protection device.

10. The method of claim 1, further comprising:
eliminating one or more of the potentially disturbed lateral line segments as a candidate for inspection by a dispatch crew based on at least one of the type of protection device predicted to have cleared the disturbance, one or more characteristics of the predicted protection device and phase or phases impacted by the disturbance; and
displaying the candidate potentially disturbed lateral line segments on a digital map.

11. A system for identifying a disturbance in a multiphase power distribution network which includes a substation and a plurality of feeders for distributing power downstream from the substation, each feeder including one or more three-phase main lines and a plurality of lateral lines isolatable from the corresponding main line by a protection device, the lateral lines having a plurality of segments each of which corresponds to a section of a lateral line terminated by a pair of physically-accessible nodes disposed along that lateral line, the system comprising:
a first unit operable to construct a connectivity model for the three-phase main lines and the lateral lines of the feeders, including the single-phase and double-phase lateral line segments, the connectivity model for each line segment comprising the physically-accessible nodes that terminate each line segment, a single, double or three phase designation for each line segment, and one or more characteristics of the protection device for the line segment;
a second unit operable to, for each lateral line segment of the feeder for which the disturbance is detected:
calculate shrift-circuit currents expected at one end of the feeder if the disturbance occurred at the physically-accessible nodes that terminate the lateral line segment, based on a fault model that indicates fault currents expected at the physically-accessible nodes under different fault conditions; and
determine whether a current reported for the disturbance lies between the short-circuit currents; and
a third unit operable to identify each lateral line segment for which the reported current lies between the calculated short-circuit currents as a potentially disturbed lateral line segment, wherein the potentially disturbed segment is restored for service based on its identification by the third unit.

12. The system of claim 11, wherein the second unit is operable to determine the fault model by:
determining three sequence networks for the multiphase power distribution network that contains single-phase, double-phase and three-phase line segments;
determining three bus impedance matrices for each sequence network;
simulating the detected disturbance with a fault impedance at each node terminating each line segment; and
calculating the short-circuit currents expected at one or more select locations for each node in the circuit.

13. The system of claim 12, wherein the second unit is operable to simulate the detected disturbance over a range of fault impedances at each node in the circuit, and wherein the third unit is operable to identify each lateral line segment as a potentially disturbed lateral line segment for which the reported current lies between the short-circuit currents for any fault impedance in the range of fault impedances.

14. The system of claim 13, wherein the second unit is operable to simulate the detected disturbance for each lateral line segment of the feeder for which the disturbance is detected at a plurality of incremental impedance values between a starting value of the range of fault impedances and an ending value of the range of fault impedances.

15. The system of claim 11, wherein the multiphase power distribution network includes power generation sources at first and second ends of one or more of the feeders, wherein the second unit is operable to calculate the short-circuit currents at the first and second ends of the feeder for each lateral line segment of a feeder having power generation sources at both ends, wherein a current is reported for the disturbance at the first and second ends of the feeder, and wherein the third unit is operable to identify each lateral line segment for which the reported current at the first end of the feeder lies between the short-circuit currents calculated tier the first end of the feeder and the reported current at the second end of the feeder lies between the short-circuit currents calculated for the second end of the feeder as a potentially disturbed lateral line segment.

16. The system of claim 11, wherein for each potentially disturbed lateral line segment, the third unit is operable to identify:
the phase designation for the potentially disturbed lateral line segment;
the type of protection device connected to the lateral line of the potentially disturbed lateral line segment; and one or more characteristics of the protection device if the protection device is a lateral protection device.

17. The system of claim 16, wherein the third unit is operable to eliminate a potentially disturbed lateral line segment as a candidate for inspection by a dispatch crew if the phase designation of the potentially disturbed lateral line segment does not include all phases affected by the disturbance.

18. The system of claim 16, wherein the third unit is operable to eliminate a potentially disturbed lateral line segment as a candidate for inspection by a dispatch crew if the type of protection device for the potentially disturbed lateral line segment does not match the type of protection device predicted to have cleared the disturbance.

19. The system of claim 16, wherein the predicted protection device is a lateral protection device having one or more predetermined characteristics, and wherein the third unit is operable to eliminate a potentially disturbed lateral line segment as a candidate for inspection by a dispatch crew if the one or more characteristics of the protection device for the potentially disturbed lateral line segment do not match the one or more predetermined characteristics of the predicted lateral protection device.

20. The system of claim 11, wherein the third unit is operable to eliminate one or more of the potentially disturbed lateral line segments as a candidate for inspection by a dispatch crew based on at least one of the type of protection device predicted to have cleared the disturbance, one or more characteristics of the predicted protection device and phase or phases impacted by the disturbance.

* * * * *